United States Patent
Douskey et al.

(10) Patent No.: US 9,529,046 B2
(45) Date of Patent: Dec. 27, 2016

(54) PARTITIONED SCAN CHAIN DIAGNOSTICS USING MULTIPLE BYPASS STRUCTURES AND INJECTION POINTS

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/573,975

(22) Filed: Dec. 17, 2014

(65) Prior Publication Data

US 2016/0169969 A1     Jun. 16, 2016

Related U.S. Application Data

(63) Continuation of application No. 14/568,440, filed on Dec. 12, 2014.

(51) Int. Cl.
| | |
|---|---|
| *G01R 31/3177* | (2006.01) |
| *G06F 11/00* | (2006.01) |
| *G06F 11/25* | (2006.01) |
| *G06F 7/02* | (2006.01) |
| *G01R 31/3185* | (2006.01) |

(52) U.S. Cl.
CPC ........... *G01R 31/318583* (2013.01); *G01R 31/318563* (2013.01)

(58) Field of Classification Search
CPC ........... G06F 11/2236; G01R 31/31724; G01R 31/31835; G01R 31/318541; G01R 31/318555
USPC ............................. 714/726, 733, 734, 736, E11.023,714/E11.029, E11.155, 37, 48, 724, 727, 799,714/819
See application file for complete search history.

(56) References Cited

U.S. PATENT DOCUMENTS

| | | | |
|---|---|---|---|
| 5,615,217 A | 3/1997 | Horne et al. | |
| 5,925,143 A | 7/1999 | Gillis et al. | |
| 5,949,272 A | 9/1999 | Bickford et al. | |
| 6,059,451 A * | 5/2000 | Scott ............... | G01R 31/31837 714/726 |
| 6,081,913 A | 6/2000 | Narayanan et al. | |
| 6,314,539 B1 | 11/2001 | Jacobson et al. | |

(Continued)

OTHER PUBLICATIONS

"An XOR Latch Design for Stuck-At Fault Detection," An ip.com Prior Art Database Technical Disclosure, Disclosed Anonymously, Dec. 8, 2006, 4 pages.

(Continued)

*Primary Examiner* — Phung M Chung

(57) ABSTRACT

A method and apparatus are provided for isolating a defect in a scan chain comprising a plurality of components of an integrated circuit. A plurality of injection points may be positioned along the scan chain. Each injection point may be configured to introduce binary test data. A plurality of bypass structures may each be configured to selectively direct a flow of the binary test data to generate a plurality of partitioned scan paths. Test logic may be configured to execute a plurality of tests using the plurality of partitioned scan paths and to combine results of the plurality of tests to isolate a faulty component of the plurality of components.

13 Claims, 9 Drawing Sheets

(56) References Cited

U.S. PATENT DOCUMENTS

| | | | |
|---|---|---|---|
| 6,587,996 B1 | 7/2003 | Reohr, Jr. et al. | |
| 6,877,121 B1 | 4/2005 | Srinivasaiah et al. | |
| 6,988,230 B2 | 1/2006 | Vermeulen et al. | |
| 7,269,770 B1 | 9/2007 | Chung et al. | |
| 7,752,514 B2 | 7/2010 | Huisman et al. | |
| 7,966,538 B2* | 6/2011 | Bertacco | G06F 11/2236 714/736 |
| 8,051,368 B2* | 11/2011 | Bertacco | G06F 11/2236 714/819 |
| 8,103,926 B2 | 1/2012 | Gizdarski | |
| 8,341,473 B2* | 12/2012 | Bertacco | G06F 11/2236 714/724 |
| 8,479,067 B2 | 7/2013 | Chandra et al. | |
| 8,726,108 B2 | 5/2014 | Tekumalla et al. | |
| 2004/0268195 A1* | 12/2004 | Eustis | G01R 31/31855 714/726 |
| 2006/0129900 A1* | 6/2006 | Clark | G01R 31/31857 714/726 |
| 2011/0214014 A1* | 9/2011 | Bertacco | G06F 11/2236 714/15 |
| 2012/0278672 A1 | 11/2012 | Sinanoglu | |
| 2013/0185608 A1 | 7/2013 | Bhawmik | |

OTHER PUBLICATIONS

U.S. Appl. No. 14/606,145 entitled "Implementing Enhanced Scan Chain Diagnostics Via Bypass Multiplexing Structure", filed Jan. 27, 2015, 29 pp.

U.S. Appl. No. 14/697,032 entitled "Implementing Enhanced Scan Chain Diagnostics Via Bypass Multiplexing Structure", filed Apr. 27, 2015, 29 pp.

* cited by examiner

PARTITIONED SCAN CHAIN DIAGNOSTICS USING MULTIPLE BYPASS STRUCTURES AND INJECTION POINTS

I. CROSS REFERENCE TO RELATED APPLICATIONS

This application is a continuation application and claims priority from U.S. patent application Ser. No. 14/568,440, entitled "PARTITIONED SCAN CHAIN DIAGNOSTICS USING MULTIPLE BYPASS STRUCTURES AND INJECTION POINTS," filed on Dec. 12, 2014, which is incorporated herein in its entirety.

II. FIELD OF THE DISCLOSURE

The present disclosure relates generally to the design of circuits of integrated circuits, and more particularly, to testing integrated circuits for fault isolation.

III. BACKGROUND

A circuit design may include a plurality of latches, such as shift register latches (SRLs), which are catenated to form a level sensitive scan design (LSSD) scan chain. As a part of quality control, patterns of logic "0" and logic "1" may be shifted into scan chains to observe an output of a scan chain under test. Because the circuitry of the scan chain is wired in series, a fault encountered in the scan chain can obscure downstream determinations as to the functionality of scan chain components. As a result, an entire logic circuit may be discarded, resulting in waste and inefficiency. Diagnosing failing locations can lead to fabrication process and design changes that improve later yield and reduce this waste.

IV. SUMMARY OF THE DISCLOSURE

According to an embodiment, an apparatus is configured to identify a defect in a scan chain comprising a plurality of components of an integrated circuit. A plurality of injection points may be positioned along the scan chain. Each injection point may be configured to introduce binary test data. A plurality of bypass structures may each be configured to selectively direct a flow of the binary test data to generate a plurality of partitioned scan paths. Test logic may be configured to execute a plurality of tests using the plurality of partitioned scan paths and to combine results of the plurality of tests to isolate a faulty component of the plurality of components.

According to another embodiment, a method of determining a faulty component in an integrated circuit may include generating first and second partitioned scan chains using a plurality of bypass structures within a scan chain comprising a plurality of components of an integrated circuit. Analysis may be performed on the first and second partitioned scan chains using a plurality of injection points to generate second results to produce first and second test results. The first and second test results may be used to isolate a fail associated with a component of the plurality of components.

According to another embodiment, a computer readable storage medium includes instructions that when executed by a processor, cause the processor to generate first and second partitioned scan chains using a plurality of bypass structures within a scan chain comprising a plurality of components of an integrated circuit. Analysis on the first and second partitioned scan chains may be performed using a plurality of injection points to generate second results to produce first and second test results. The first and second test results may be used to isolate a fail associated with a component of the plurality of components.

An embodiment of the system may identify and reduce fail data associated with testing an integrated circuit. Embodiments of the system may improve the diagnostic time for isolating a failing latch in a scan chain, and improvements may be made to improve production. Use of the bypass structures, injection points, and partitioned scan chains may allow analysis of downstream components that might have otherwise been indeterminable.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

V. BRIEF DESCRIPTION OF THE DRAWINGS

FIG. 1 generally illustrates a data processing apparatus configured to detect and isolate faults in an integrated circuit;

VI. DETAILED DESCRIPTION

Figure 1:
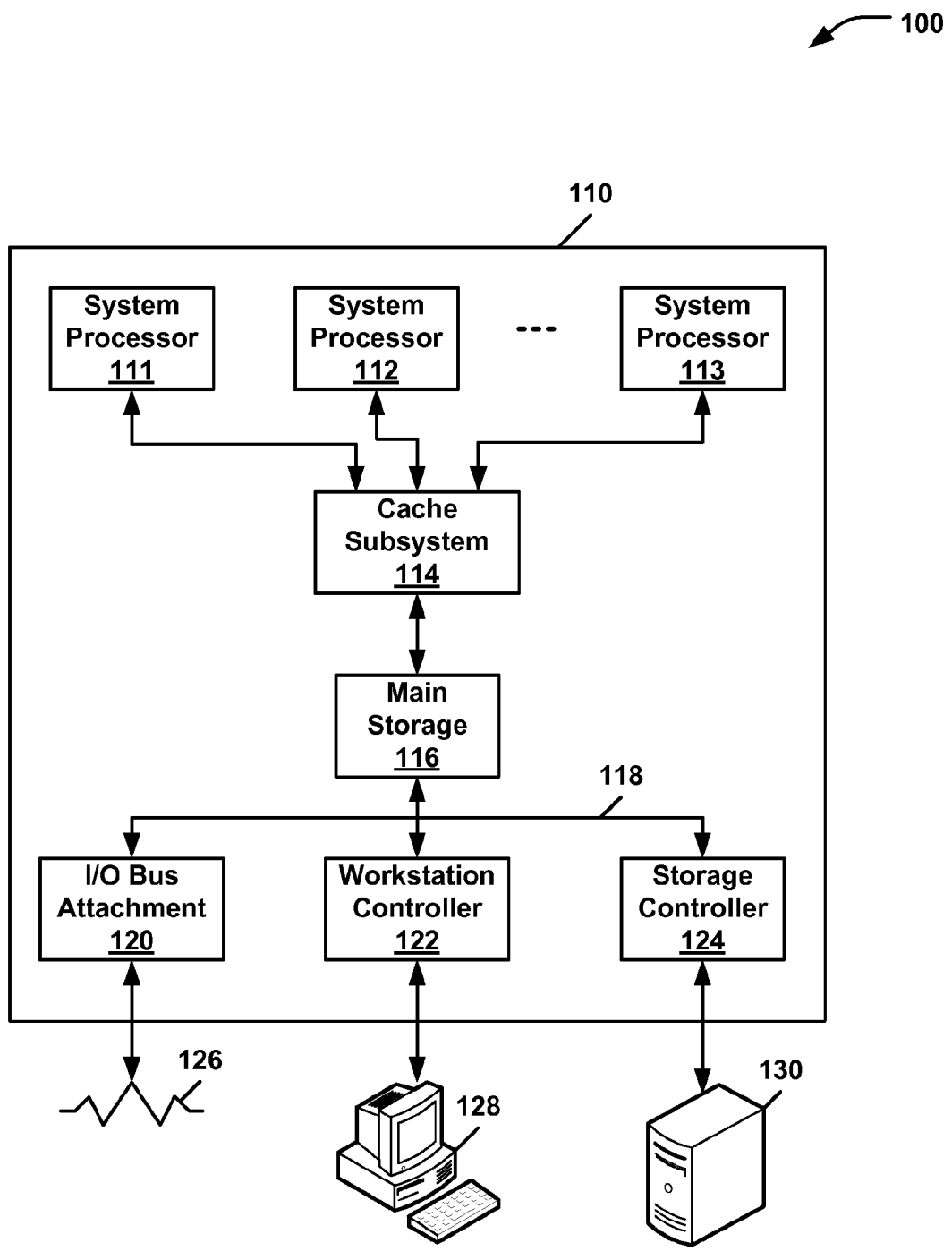

An embodiment of a system may identify and reduce fail data associated with testing an integrated circuit. Multiple bypass structures and injection points may be positioned for testing purposes within a scan chain comprising a plurality of latches, clocks, and associated connections. The injection points (e.g., XOR gates) and the bypass structures (e.g., multiplexers) may be used to find alternative paths that route around a component that is determined to be defective. Iterations of tests may be performed, and their results combined, to determine a functional status of other components in the scan chain that might otherwise be unknown.

A first test may include a full analysis of an entire scan chain. Subsequent tests may include partitioned paths of the scan chain. The XOR gates and the bypass multiplexers may be used to logically partition the scan chain into multiple sections, or paths. Multiple scan results may be iteratively combined to determine the functional status of a component in the scan chain. In an embodiment, the bypass structures and the injection points are included for testing purposes and are distinct latches and other components that perform the intended function of the integrated circuit design.

An embodiment includes a method that partitions a full scan chain into separate chains using bypass multiplexers with independent controls. The partitioning allows scan data to be routed through different sections of the scan chain, potentially bypassing failing latches. Each partitioned section may also include an XOR gate to allow data changing even if the data is fed from a previous defect. The information acquired from a combination of full scans and partitioned scans may be used to pinpoint combinations of stuck-at-zero and stuck-at-one faults in the scan chain.

According to a particular embodiment, a scan chain diagnostic may insert values using an injection point, such as an XOR gate, periodically into a scan path. The XOR gate may inject values beyond failing locations to detect a fail closest to a scan output pin. One input of each XOR gate may be received from a previous latch in the scan chain. Another input into each XOR gate may comprise a global injection signal that allows a change of data polarity when scanning. This data polarity change would otherwise be impossible when a stuck at condition exists in the scan chain. All of the XOR gates in each scan chain may receive the global insertion signal for use in failure isolation.

A scan chain may include a plurality of injection points, such XOR gates, and a plurality of bypass components, such as multiplexers. An XOR gate may be used to inject data at point in the scan chain that is removed (e.g., above or below in the scan chain) an encountered fault. A multiplexer may be used to jump, or reroute, partitioned paths around a discovered fault so as to determine the status of downstream components in the scan chain. Multiple tests may be performed, and program code may logically combine the results from those tests to determine the pass/fail status of scan chain components (e.g., latches, connections, and clocks).

After finding a lowest fail location of either a stuck-at-zero or a stuck-at-one using XOR diagnostics, an embodiment of a method attempts to find a lowest failing location in another diagnostic partitioned scan chain path. The method may then work its way back up the scan ring, hopping between proven working sections of each partitioned scan chain path.

In operation, a fail in a scan chain may be encountered. For example, an XOR gate may inject test data into the scan chain. Based on the results of the first XOR injection test, a defective component may be encountered. A multiplexer may be used to navigate around the encountered faulty component. More tests may be conducted using multiplexers to bypass the faulty component. The results from the tests, or bypass scans, may be combined to determine the status of other components in the scan chain. The determination may have otherwise been obscured after encountering the first defective component.

The examples in the drawings demonstrate manners in which program code may use and combine test results to determine the functional status of components of the scan chain. For example, FIG. 1 generally illustrates a data processing apparatus 100 configured to detect and isolate faults in an integrated circuit. The apparatus 100 may generally include a computer, a computer system, a computing device, a server, a disk array, client computing entity, or other programmable device, such as a multi-user computer, a single-user computer, a handheld device, a networked device (including a computer in a cluster configuration), a mobile phone, a video game console (or other gaming system), etc. The apparatus 100 may be referred to as a logically partitioned computing system or computing system, but may be referred to as computer for the sake of brevity. One suitable implementation of the computer 110 may be a multi-user computer, such as a computer available from International Business Machines Corporation (IBM).

The computer 110 generally includes one or more physical processors 111, 112, 113 coupled to a memory subsystem including a main storage 116. The main storage 116 may include a flash memory, a hard disk drive, and/or another digital storage medium. The processors 111, 112, 113 may be multithreaded and/or may have multiple cores. A cache subsystem 114 is illustrated as interposed between the processors 111, 112, 113 and the main storage 116. The main storage 116 may include logic, or other program code, configured to determine and isolate faulty components. The cache subsystem 114 typically includes one or more levels of data, instruction and/or combination caches, with certain caches either serving individual processors or multiple processors.

The main storage 116 may be coupled to a number of external input/output (I/O) devices via a system bus 118 and a plurality of interface devices, e.g., an I/O bus attachment interface 120, a workstation controller 122, and/or a storage controller 124 that respectively provide external access to one or more external networks 126, one or more workstations 128, and/or one or more storage devices 130, such as a direct access storage device (DASD). The system bus 118 may also be coupled to a user input (not shown) operable by a user of the computer 110 to enter data (i.e., the user input sources may include a mouse, a keyboard, etc.) and a display (not shown) operable to display data from the computer 110 (i.e., the display may be a CRT monitor, an LCD display panel, etc.), and an optical sensor (not shown). The computer 110 may also be configured as a member of a distributed computing environment and communicate with other members of that distributed computing environment through a network 126.

Figure 2:
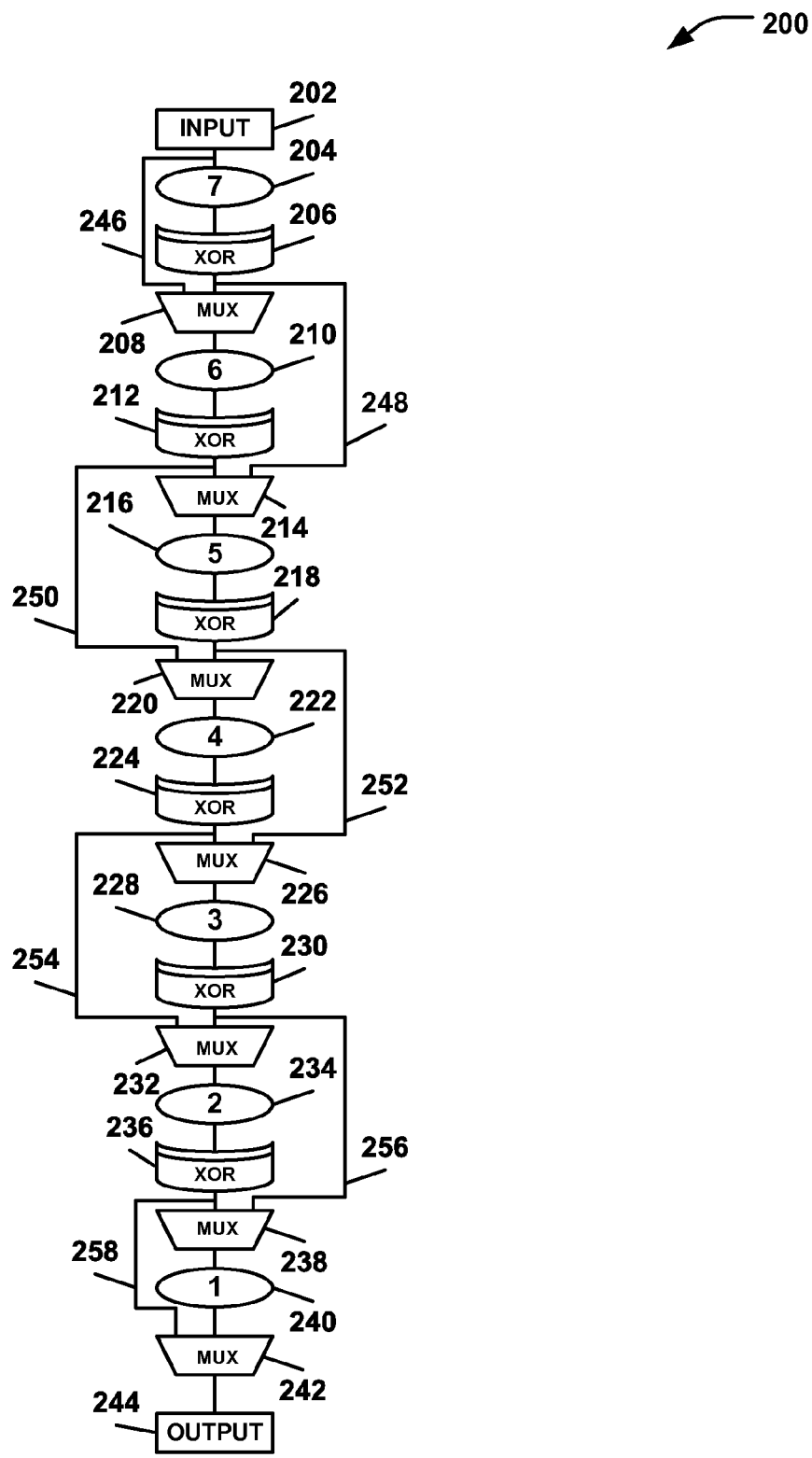
FIG. 2 shows a scan chain structure that includes a partition, or division, into two partial, or partitioned scan chain paths.

FIG. 2 shows a scan chain structure 200 that includes a partition, or division, into two partial, or partitioned scan chain paths. The full scan chain 200 may be divided into separate scan chain paths using bypass multiplexers MUX 208, MUX 214, MUX 220, MUX 226, MUX 232, MUX 238, MUX 242. Each bypass multiplexer MUX 208, MUX 214, MUX 220, MUX 226, MUX 232, MUX 238, MUX 242 may have an independent select function. The independent select may comprise separate wires or a decoding operation. The alternate, partitioned scan chain paths may be fed from an upstream tap point in the scan chain. Each partitioned path, or section, may have a unique path from the scan input 202 to the scan output 244.

As shown in FIG. 2, a first partitioned scan chain path may comprise: latches 204, XOR 206, MUX 214, latches 216, XOR 218, MUX 226, latches 228, XOR 230, MUX 238, latches 240, and connections 246, 250, 254, 258. A second partitioned scan chain path may comprise: MUX 208, latches 210, XOR 212, MUX 220, latches 222, XOR 224, MUX 232, latches 234, XOR 236, MUX 242, and connections 250, 254, 258. There are two independent select signals for all the MUXes on each of the two possible reduced scan chain paths.

Spacing of the XOR gates 206, 212, 218, 224, 230, 236 and the multiplexers 208, 214, 220, 226, 232, 238, 242 may be determined according to a desired granularity of fail accuracy, balanced with a threshold for additional logic and wiring. Other determining factors may include an area practical for failure analysis and considerations regarding a sharing of clocks.

After finding a lowest fail location of either a stuck-at-zero or a stuck-at-one using XOR diagnostics, an embodiment of a method attempts to find a lowest failing location in another diagnostic partitioned scan chain path. The method may then work its way back up the scan ring, hopping between proven working sections of each partitioned scan chain path.

A test procedure may involve several sequenced processes used to diagnose a scan chain fail. After a first full scan of the scan chain fails, a first process may execute an XOR full scan test to determine a lowest failing location and path. If those tests fail, a next process may execute partitioned path scan tests. The scan test may load and unload the scan chain with an appropriate selected path. To diagnosis both stuck-at-0 and stuck-at-1 faults, a zero scan and a one scan may be performed, resulting in six tests for two partitioned scan chains. Depending on the results of those tests, further processes may be taken, as illustrated in the following figures.

Figure 3:
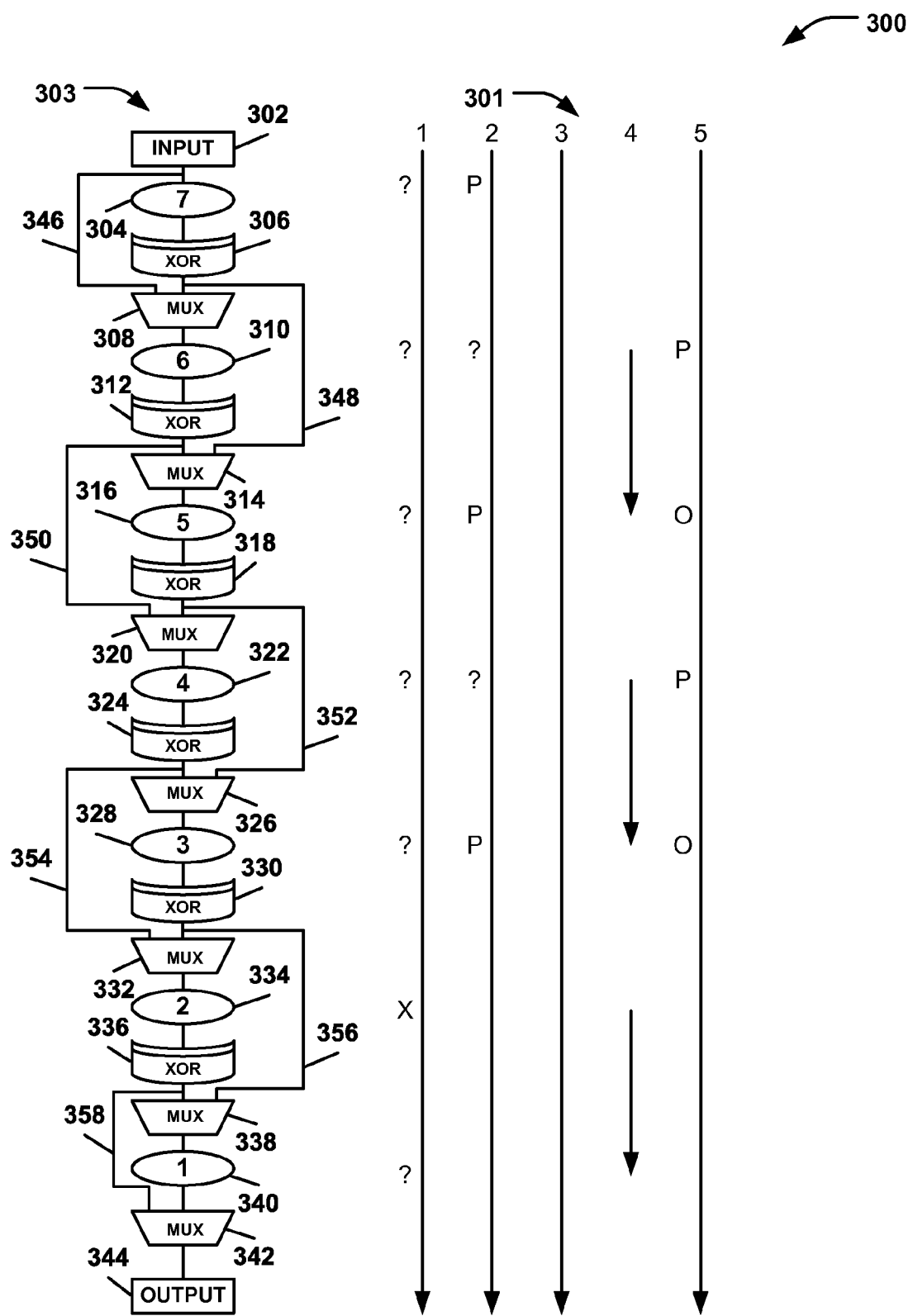
FIG. 3 shows a second example of test diagnostic that includes component pass and fail results, in addition to a corresponding scan chain.

FIG. 3 shows an example of test diagnostic 300 that includes component pass and fail results 301 in conjunction with an associated scan chain 303. The results 301 shown in FIG. 3 denote: "P" for passing, "?" for unknown, "O" for observing, and "X" for failing. The results 301 may correspond to data tested at the numbered latches 304 ("7"), 310 ("6"), 316 ("5"), 322 ("4"), 328 ("3"), 334 ("2"), 340 ("1") for five test runs. As shown in column 1, the test results 301 of the first test procedure reveal a single fail with a stuck-at-0 data at latch 334 ("2"). In the example, a first full scan test may be run during a first test run. Because a fail is encountered at latch 334 ("2"), further results down the line scan chain for latches 304 ("7"), 310 ("6"), 316 ("5"), 322 ("4"), 328 ("3") may be indeterminable using only the first test results.

Column 2 of the results 301 correspond to a test that bypasses the known fail 336 and all sections 322, 310 with the same bypass selection. More particularly, a first partitioned scan chain path (e.g., MUX 314, latches 316, XOR 318, MUX 326, latches 328, XOR 330, MUX 338, latches 340, and connections 348, 352, 356) may reveal a passing or new failing result in column 2. In this case column 2 shows a passing result and can be used to further diagnose the chain. Columns 3, 4 and 5 represent the next test sequence that determines passing or failing sections on the same bypassed chain as the known fail. Column 3 may correspond to initialization using the known good path from column 2 (e.g., a first path may comprise latches 304, XOR 306, MUX 314, latches 316, XOR 318, MUX 326, latches 328, XOR 330, MUX 338, latches 340, and connections 346, 350, 354, 358) that also may load each of the bypassed paths (e.g., stubbed latches 304, 316, 328, and 340) and may have no errors. Subsequent test step in column 4 corresponds to using the non-bypassed full scan mode to move data from previously stubbed latches into known good latches, with column 5 may use the known good (bypassing known fail) second path to pull in sections from the first path to determine that there are no additional fails. As such, the fail may be isolated to one grouping of latches.

Figure 4:
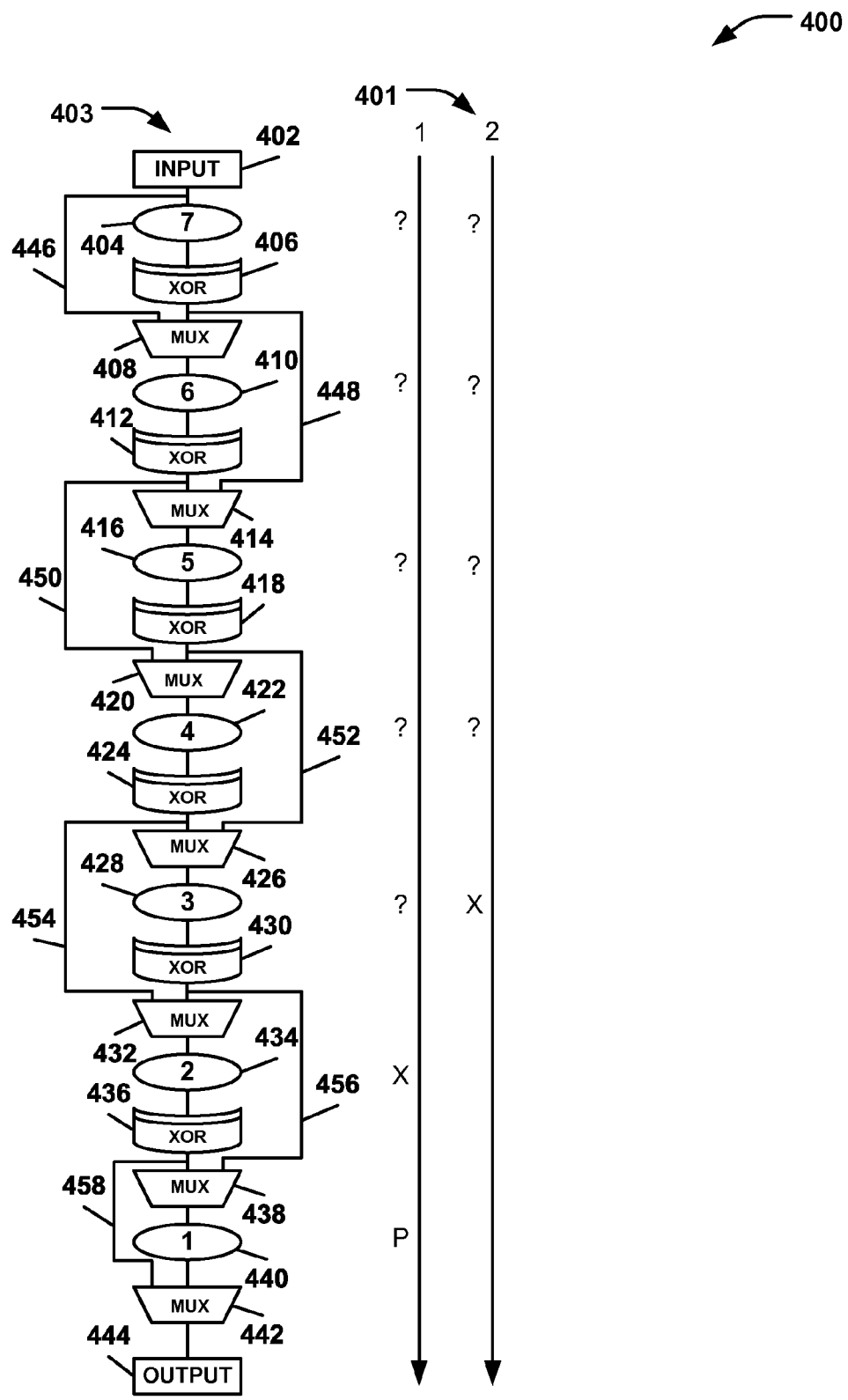
FIG. 4 shows a third example of test diagnostic that includes component pass and fail results, in addition to a corresponding scan chain.

FIG. 4 shows another example of test diagnostic 400 that includes component pass and fail results 401, in addition to an associated scan chain 403. The results 401 shown in FIG. 4 correspond to data tested at the numbered latches 404 ("7"), 410 ("6"), 416 ("5"), 422 ("4"), 428 ("3"), 434 ("2"), 440 ("1") for two test procedures. The test results 401 of the first test procedure reveal fail with stuck-at-0 data at bits 434 ("2") and 428 ("3"). In the example, a first full scan test may be executed, as represented by column 1. In the full scan, a fail is encountered at latch 334 ("2"). A scan for the partitioned paths in column 2 reveals a fail at latch 428 ("3"). Fails may be isolated to two bits in two tests, with no further diagnostics that may be performed.

Figure 5:
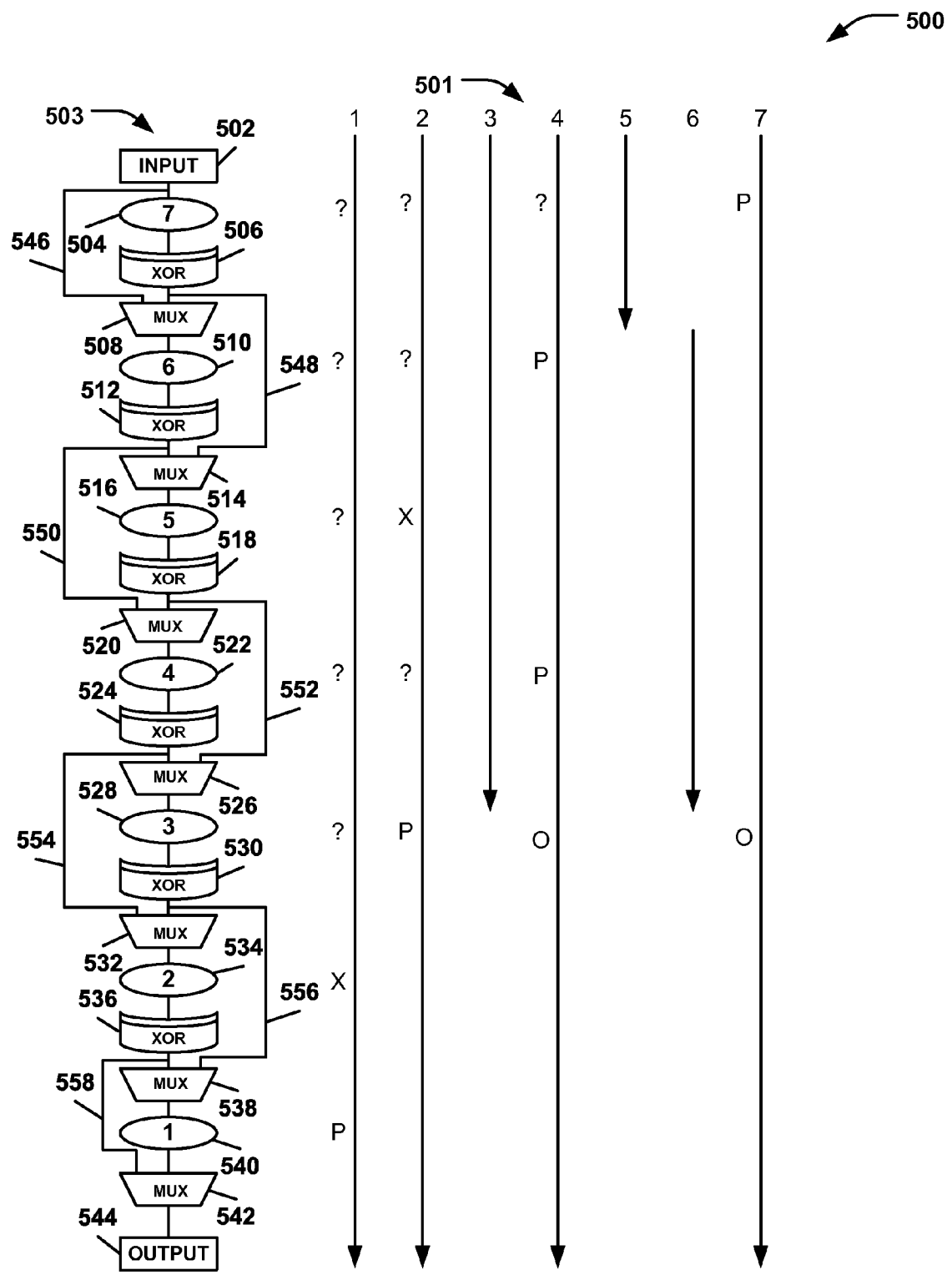
FIG. 5 shows a fourth example of test diagnostic that includes component pass and fail results, in addition to a corresponding scan chain.

FIG. 5 shows a third example of test diagnostic 500 that includes component pass and fail results 501 and an associated scan chain 503. The results 501 shown in FIG. 5 denote pass, fail, and indeterminate statuses that correspond to binary values tested at the numbered latches 504 ("7"), 510 ("6"), 516 ("5"), 522 ("4"), 528 ("3"), 534 ("2"), 540 ("1") for seven test procedures.

A first scan (i.e., columns 1 and 2 of the results 501) may include a full XOR scan attempt of the entire scan chain 503. The test results 501 of the first test procedure reveal fails with stuck-at-zero data at latches 534 ("2"). Multiplexers 526, 514 may be used to navigate around known failing latches 534 ("2") and latches 522, 510. The test results 501 of the second test procedure ("2") reveal fails with stuck-at-zero data at latches 516 ("5"). Arrows may represent the dataflow direction in which the binary values are loaded.

In addition to the fails encountered during the first two scan tests, marked passes may be revealed in column 1 at latches 540 ("1") and in column 2 at latches 528 ("3"). Scans for the partitioned scan chain paths may reveal fails in non-adjacent latch 516 ("5") of another partitioned scan chain path. Fails may be isolated to two latches in two test procedures.

Column 3 shows a scan of a second partitioned scan chain path comprising: MUX 508, latches 510, XOR 512, MUX 520, latches 522, XOR 524, MUX 532, latches 534, XOR 536, MUX 542, and connections 548, 552, 556 may move data above a fail in the second path. The system 500 may use results of a scan of a first partitioned scan chain path shown in column 4 (i.e., latches 504, XOR 506, MUX 514, latches 516, XOR 518, MUX 526, latches 528, XOR 530, MUX 538, latches 540, and connections 546, 550, 554, 558) to pull out passing marks in latches 510 ("6") and latches 522 ("4"). The scan of the first path in column 5 may be used to initialize above a failing mark 516 associated with a scan of the first path, then a scan or the second path in column 6 may be used to move the data to above the failing mark 534 associated with a scan of the second path and finally in column 7 a scan of the first path to pull out latches 504 ("7") as passing. Registered fails may be isolated to two latches in four test procedures, with no further fails present.

Figure 6:
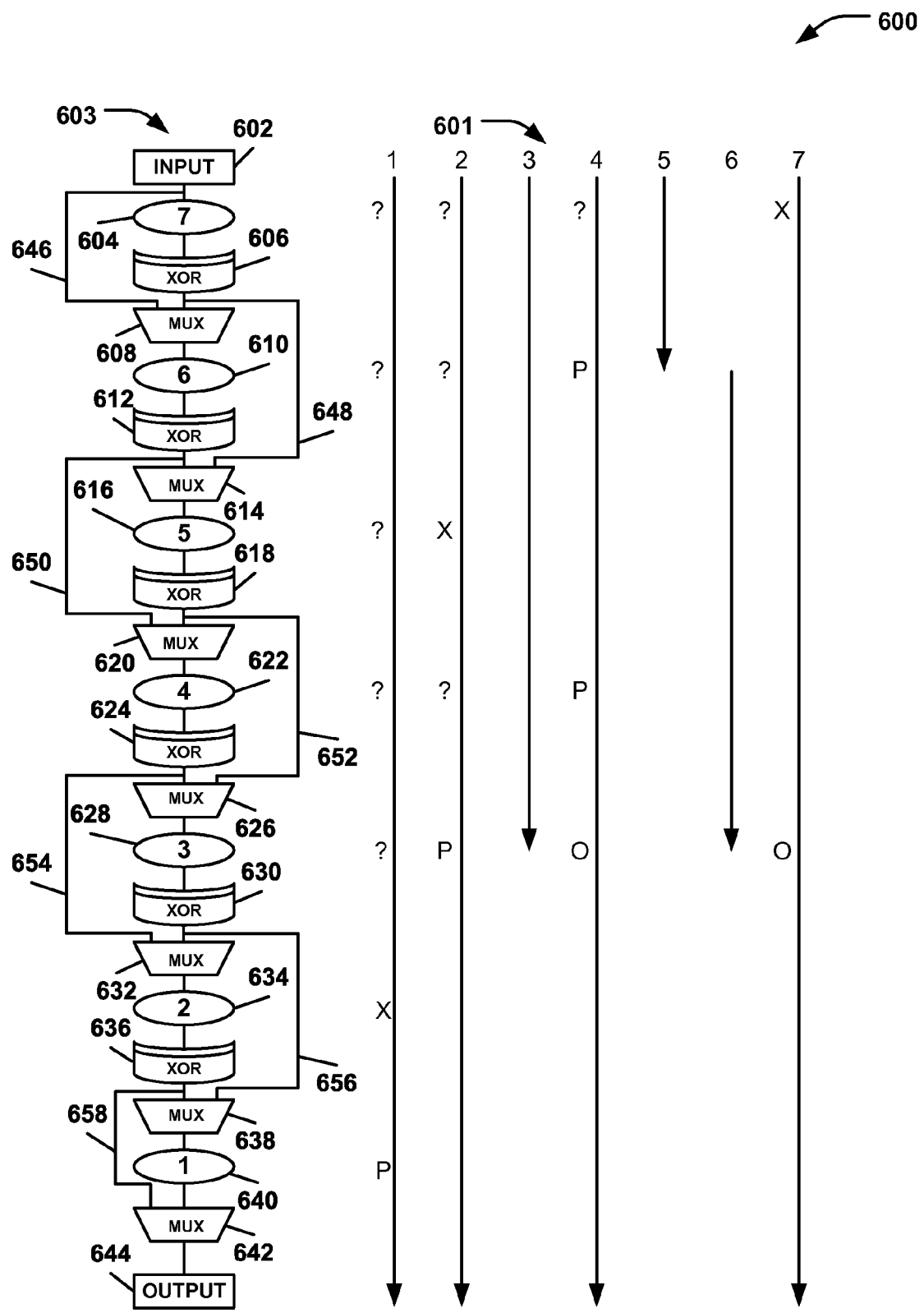
FIG. 6 shows a fifth example of test diagnostic that includes component pass and fail results, in addition to a corresponding scan chain.

FIG. 6 shows a fourth example of diagnostic test 600 that includes component pass and fail results 601 for a corresponding scan chain 603. The results 601 shown in FIG. 6 denote passing, failing, and unknown functional status associated binary values tested at the numbered latches 604 ("7"), 610 ("6"), 616 ("5"), 622 ("4"), 628 ("3"), 634 ("2"), 640 ("1") for seven test procedures.

The test results 601 of the seven test procedures may reveal a fail with stuck-at-zero data at latches 634 ("2"), 616 ("5"), and 604 ("7"). In the example, full scan tests may be run, as represented by column 1. In the full XOR scans, a fail is encountered at latches 634 ("2") in column 1, and latch 640 ("1") may be marked as passing. Multiplexers may be used to navigate around known failing latches 634 ("2") and latches 622, 610. The test results 601 of the second test procedure reveal fails with stuck-at-zero data at latches 616 ("5") and passing latches 628 ("3").

Scans for the partitioned scan chain paths may be run at columns 3 and 4 and may reveal passes in non-adjacent latches 610 ("6") and 622 ("4"). A scan of a second partitioned scan chain path may be used to move data above a fail in the first path to above a next fail in the second path.

The second path may include: MUX 608, latches 610, XOR 612, MUX 620, latches 622, XOR 624, MUX 632, latches 634, XOR 636, MUX 642, and connections 648, 652, 656. The scan of a first path (e.g., a first path may comprise latches 604, XOR 606, MUX 614, latches 616, XOR 618, MUX 626, latches 628, XOR 630, MUX 638, latches 640, and connections 646, 650, 654, 658) may then be used to pull out latches 622 ("4") and 610 ("6") as being passing.

At columns 5, 6 and 7 the scan of the first path may be used to move analysis of the second path above a failing component of the first path. The scan of the second path may move the analysis of the second path above a failing component of the second path, and then analysis of the first path may be used to pull out latch 604 ("7") as a fail. Fails may be isolated to three latches in four test processes, with no further fails identified.

Figure 7:
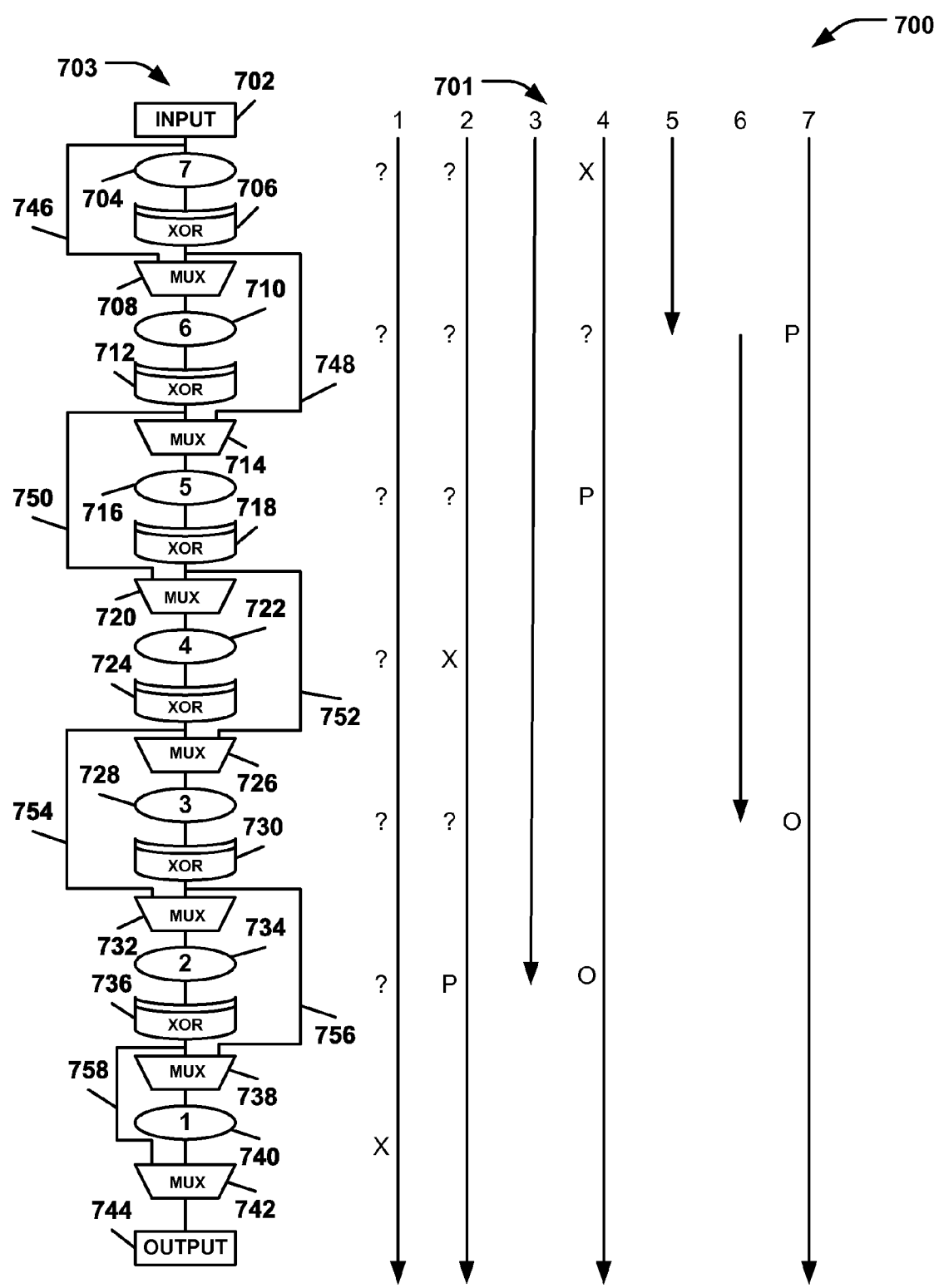
FIG. 7 shows a sixth example of test diagnostic that includes component pass and fail results, in addition to a corresponding scan chain.

FIG. 7 shows a fifth example of diagnostic test 700 that includes component pass and fail results 701 and an associated scan chain 703. The results 701 shown in FIG. 7 show passing, failing, and unidentifiable statuses that correspond to data tested at the numbered latches 704 ("7"), 710 ("6"), 716 ("5"), 722 ("4"), 728 ("3"), 734 ("2"), 740 ("1") for seven test procedures. The test results 701 of the seven test procedures reveal a fail with data at bits 704 ("7"), 722 ("4"), and 740 ("1"). In the example, a full scan tests may be run, as represented by column 1 In the full scans, a fail is encountered at latch 740 ("1") in a first partitioned scan chain path. The first partitioned scan chain path may comprise latches 704, XOR 706, MUX 714, latches 716, XOR 718, MUX 726, latches 728, XOR 730, MUX 738, latches 740, and connections 746, 750, 754, 758. Multiplexers may be used to navigate around known failing latches 740 ("1") and latches 728, 716, 704. The test results 701 of the second test procedure reveal fails with stuck-at-zero data at latches 722 ("4") and passing latches 734 ("2").

Scans for the partitioned scan chain paths may be run at columns 3 and 4 and may reveal passing statuses in non-adjacent latches 716 ("5") and a fail on latches 704 ("7"). A scan of the first partitioned scan chain path may be repeatedly used to move data to a scan of a second partitioned scan chain path. The second partitioned scan chain path may include MUX 708, latches 710, XOR 712, MUX 720, latches 722, XOR 724, MUX 732, latches 734, XOR 736, MUX 742, and connections 748, 752, 756 about a fail in the first partitioned scan chain path. A scan of the second partitioned scan chain path may result in 716 ("5") marked as passing, and 704 ("7") marked as failing.

At columns 5, 6 and 7 the scan of the first partitioned scan chain path may be used to move analysis of the second partitioned scan chain path above a failing bit of the first path. Analysis of the second partitioned scan chain path may be moved above a failed latch component using a scan of the second partitioned scan chain, and a scan of the first partitioned scan chain path may be used to pull out latches 710 ("6") as being a pass. Registered fails may be isolated to three latches in four test procedures, with no further fails identified.

Figure 8:
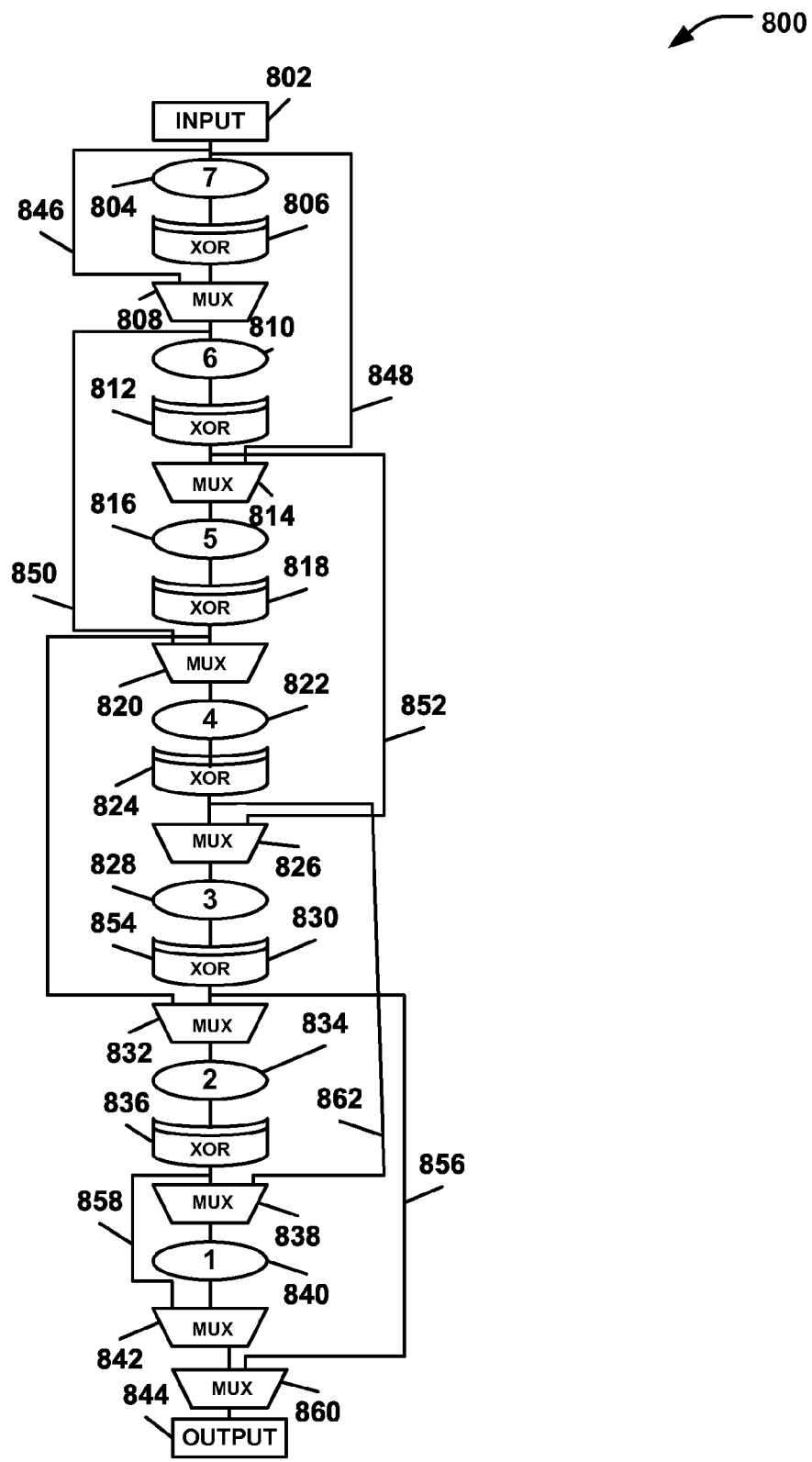
FIG. 8 shows a scan chain structure that includes three partitioned chain paths.

FIG. 8 shows a scan chain structure 800 that includes partitions, or divisions, into three partitioned scan chain paths. The full scan chain 800 may be divided into separate chains with bypass multiplexers MUX 808, MUX 814, MUX 820, MUX 826, MUX 832, MUX 838, MUX 842. Each bypass multiplexer may have an independent select. The independent select may be comprised of separate wires or a result of a decoding operation of wires. The alternate path may be fed from an upstream tap point in the scan chain. Each section may have a unique path from the scan input to the scan output.

As shown in FIG. 8, a first partitioned scan chain path may comprise: latches 804, XOR 806, MUX 820, latches 822, XOR 824, MUX 838, latches 840, and connections 850, 862. A second partitioned scan chain path may comprise: MUX 814, latches 816, XOR 818, MUX 832, latches 834, XOR 836, MUX 842, and connections 848, 854, 858. A third partitioned scan chain path may comprise: MUX 808, latches 810, XOR 812, MUX 826, latches 828, XOR 830, MUX 860, and connections 846, 852, 856.

Figure 9:
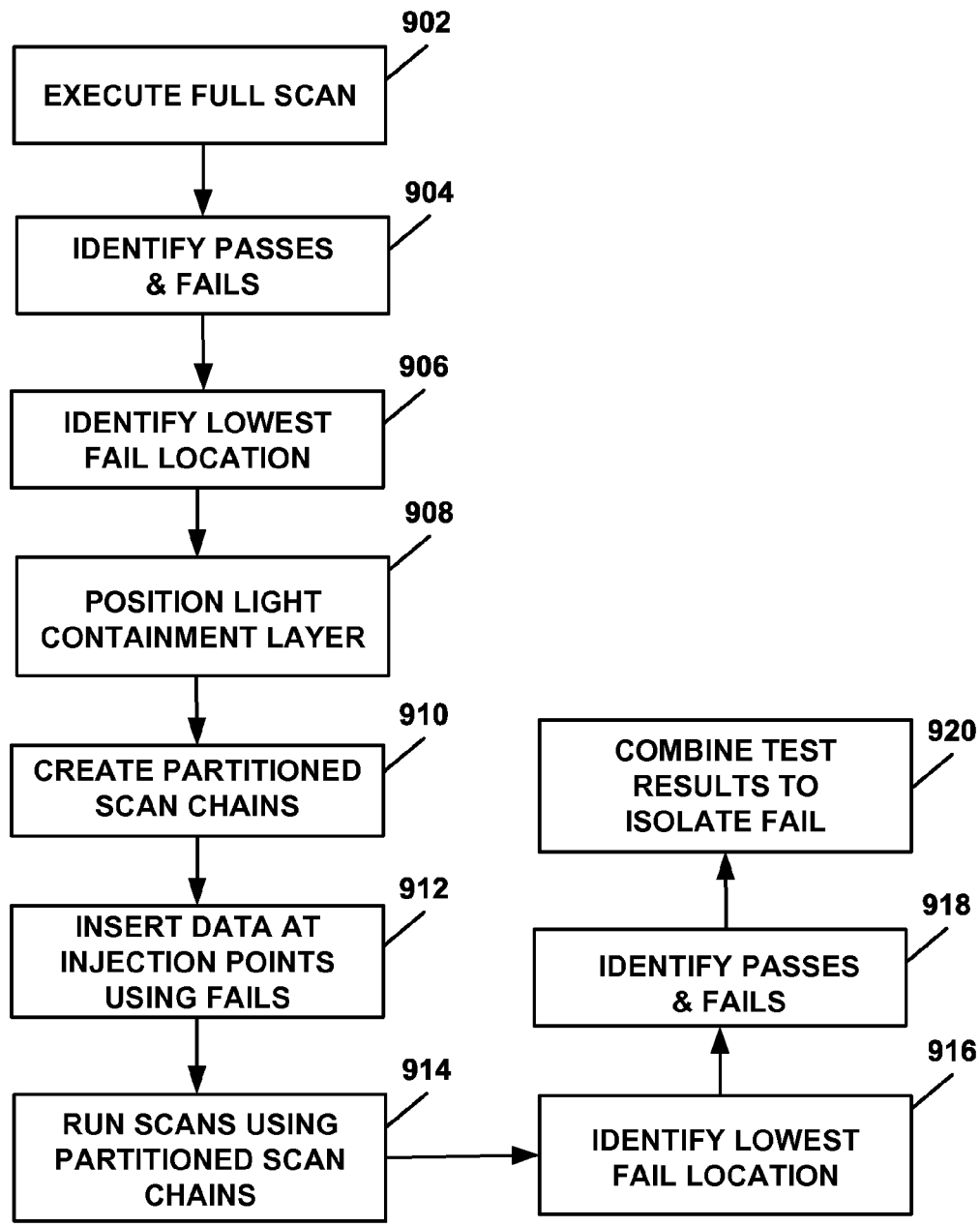
FIG. 9 is a flowchart of an embodiment of a method of determining an operational status of a component of an integrated circuit.

The flowchart of FIG. 9 is an embodiment of a method 900 of determining an operational status of a component of an integrated circuit. The method 900 may be performed by the system 100 of FIG. 1 to generate test results run on scan chains, such as those examples shown in FIGS. 2-8.

Turning more particularly to the flowchart, a full scan of a scan chain may be executed at 902. For instance, a XOR scan attempt of an entire scan chain may be performed to initially identify at 904 any passes and fails associated with components of the scan chain.

The system may determine a lowest fail location at 906 using XOR diagnostics. The lowest fail location may be used to route test traffic using bypass structures to avoid identified fails and to determine functionality of components located up the scan chain.

At 908, the system may generate partitioned scan chains using the bypass structures. Program code of an embodiment may generate the partitioned scan chains iteratively. The bypass structures may be used to route around identified defective latches and to create alternative paths to test components that might otherwise go unverified. Any number of partitioned scan chains may be generated. Binary test values maybe injected into the partitioned scan chains at 910. Insertion of the test values may be accomplished using XOR gates that are positioned in the scan chain in such a manner as to avoid known fails and to send signals to components that were previously indeterminable. Test may be conducted at 912 using the partitioned scan chains to generate multiple test results.

The system may determine a lowest fail location for each of the partitioned scan chains at 914 using XOR diagnostics. The lowest fail location may be used to route test traffic using bypass structures to avoid identified fails and to determine functionality of components located up the scan chain from identified fails. That functionality may be determined at 916, and the system may combine test results at 918 to piece together additional functionality using information from all of the results.

Particular embodiments described herein may take the form of an entirely hardware embodiment, an entirely software embodiment or an embodiment containing both hardware and software elements. In a particular embodiment, the disclosed methods are implemented in software that is embedded in processor readable storage medium and executed by a processor, which includes but is not limited to firmware, resident software, microcode, etc.

Further, embodiments of the present disclosure, such as the one or more embodiments may take the form of a computer program product accessible from a computer-usable or computer-readable storage medium providing program code for use by or in connection with a computer or any instruction execution system. For the purposes of this description, a non-transitory computer-usable or computer-readable storage medium may be any apparatus that may tangibly embody a computer program and that may contain, store, communicate, propagate, or transport the program for use by or in connection with the instruction execution system, apparatus, or device.

In various embodiments, the medium may include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and digital versatile disk (DVD).

A data processing system suitable for storing and/or executing program code may include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. An apparatus comprising:
    a scan chain comprising components of an integrated circuit;
    injection point structures positioned in the scan chain, wherein each injection point structure is configured to introduce binary test data at a respective point in the scan chain;
    bypass structures, wherein each bypass structure includes a corresponding input coupled to an output of one injection point structure in the scan chain, wherein an output of each bypass structure is coupled to one of the components, wherein each bypass structure is configured to selectively direct a flow of the binary test data to generate partitioned scan paths through the components, and wherein an output of at least one of the injection point structures is connected to two bypass structures; and
    test logic configured to execute tests using the partitioned scan paths and to combine results of the tests to isolate a faulty component of the of components.

2. The apparatus of claim 1, wherein the test logic is configured to selectively direct a flow of the binary test data away from the faulty component.

3. The apparatus of claim 1, wherein the test logic is further configured to iteratively combine the results of the tests.

4. The apparatus of claim 1, wherein one of the bypass structures comprises a multiplexer.

5. The apparatus of claim 1, wherein one of the injection point structures comprises an XOR gate.

6. The apparatus of claim 1, wherein the components include latches, clocks, and connections to the clocks and latches.

7. The apparatus of claim 1, wherein the test logic is further configured to use an injection point to inject the binary test data within the scan chain at a position before the faulty component.

8. The apparatus of claim 1, wherein combining the results includes using pass information from a first partitioned scan path to further analyze a second partitioned scan path.

9. The apparatus of claim 1, wherein the test logic is further configured to execute a full test of the entire scan chain to isolate a faulty component.

10. The apparatus of claim 1, wherein the test logic is further configured to determine a lowest fail location during a test of the plurality of tests, to inject the binary test data at a location based on the lowest fail location in the scan chain, and to test functionality of components located up the scan chain from the lowest fail location.

11. The apparatus of claim 1, wherein the test logic is further configured to determine a functional status of a component of the scan chain based on a result of the tests.

12. The apparatus of claim 1, wherein the tests include conducting a stuck-at-one test and a stuck-at-zero test using a portion of the scan chain that is common to a plurality of the tests.

13. The apparatus of claim 1, wherein positioning of the bypass structures is determined according to at least one of: a desired granularity of fail accuracy, a threshold of additional logic and wiring, a clock sharing consideration, and a physical space consideration.

* * * * *